United States Patent
Gardner et al.

(10) Patent No.: US 6,239,467 B1
(45) Date of Patent: May 29, 2001

(54) METHOD OF FORMING SEMICONDUCTOR DEVICES USING GATE ELECTRODE LENGTH AND SPACER WIDTH FOR CONTROLLING DRIVE CURRENT STRENGTH

(75) Inventors: Mark I. Gardner, Cedar Creek; H. Jim Fulford; Anthony Toprac, both of Austin, all of TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/183,616

(22) Filed: Oct. 30, 1998

Related U.S. Application Data

(62) Division of application No. 08/993,755, filed on Dec. 18, 1997, now Pat. No. 5,863,824.

(51) Int. Cl.$^7$ ........................................... H01L 29/76
(52) U.S. Cl. .................. 257/344; 257/408; 257/369; 257/900
(58) Field of Search ........................... 257/336, 344, 257/369, 371, 389, 900

(56) References Cited

U.S. PATENT DOCUMENTS

| | | |
|---|---|---|
| 4,994,866 * | 2/1991 | Awano ............................... 357/16 |
| 5,296,401 * | 3/1994 | Mitsui et al. ...................... 437/57 |
| 5,733,812 | 3/1998 | Ueda et al. . |
| 5,789,780 | 12/1996 | Fulford et al. . |

OTHER PUBLICATIONS

The American Heritage Dictionary, Second College Edition, p. 162, 1982.*

* cited by examiner

*Primary Examiner*—Sara Crane

(57) ABSTRACT

A semiconductor device having a controlled drive current strength is produced by varying spacer width to accommodate any variation in gate electrode length from a desired value. After formation of the gate electrode on a substrate, the length is measured and compared to a desired value. Based on any differences between the measured and desired values, the width of spacer is determined in order to counteract the variation in gate electrode length. This results in maintaining the desired channel length after dopant implanting, to provide the desired drive current strength. The present process permits close control over the drive current strength of semiconductor devices and also decreased variation within and between lots and corresponding increases in productivity.

17 Claims, 3 Drawing Sheets

METHOD OF FORMING SEMICONDUCTOR DEVICES USING GATE ELECTRODE LENGTH AND SPACER WIDTH FOR CONTROLLING DRIVE CURRENT STRENGTH

This application is a Divisional of application Ser. No. 08/993,755, filed Dec. 18, 1997, U.S. Pat. No. 5,863,824 which application(s) are incorporated herein by reference.

FIELD OF THE INVENTION

The present invention is generally directed to the manufacture of semiconductor devices. More particularly, the invention is directed to the manufacture of semiconductor devices in which the drive current strength of the transistors can be controlled using gate electrode length and spacer width.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicabilities and numerous disciplines. An example of such a silicon-based semiconductor device is a metal-oxide-semiconductor (MOS) transistor. The principle elements of a typical MOS semiconductor device are illustrated in FIG. 1. The device generally includes a gate electrode 101, which acts as a conductor, to which an input signal typically is applied via a gate terminal (not shown). Heavily doped source region 103 and drain region 105 are formed in a semiconductor substrate 107, and respectively are connected to source and drain terminals (not shown).

A channel region 109 is formed in the semiconductor substrate 107 beneath the gate electrode 101 and separates the source region 103 and drain region 105. The channel typically is lightly doped with a dopant of a type opposite to that of the source and drain regions. The gate electrode 101 is physically separated from the semiconductor substrate 107 by a gate insulating layer 111. Typically, this insulating layer is an oxide layer such as $SiO_2$. The insulating layer 111 is provided to prevent current from flowing between the gate electrode 101 and the semiconductor source region 103, drain region 105 or channel region 109.

In operation, an output voltage typically is developed between the source and drain terminals. When an input voltage is applied to the gate electrode 101, a transverse electric field is set up in the channel region 109. By varying the transverse electric field, it is possible to modulate the conductance of the channel region 109 between the source region 103 and drain region 105. In this manner, an electric field controls the current flow through the channel region 109. This type of device commonly is referred to as a MOS field-effect transistor (MOSFET). Semiconductor devices such as the one described are used in large numbers to construct most modern electronic devices. In order to increase the capability of such electronic devices, it is necessary to integrate ever larger numbers of such devices into a single silicon wafer. As the semiconductor devices are scaled down in order to form a larger number of such devices on a given surface area, the structure of the devices and the fabrication techniques used to make the devices must be altered.

One important property of MOS devices is drive current strength. It is particularly important to provide semiconductor devices that exhibit the designed drive current strength. It also is desirable to maintain a substantially constant drive current strength between production lots and within a single production lot.

The drive current strength is inversely proportional to channel length. The length of the channel is determined by the dimensions of the gate electrode and any spacers that are present on the sides of the gate electrode during dopant implanting steps. As the dimensions of semiconductor devices become smaller and smaller, production variations in channel length, resulting, for example, from variations in gate electrode or spacer dimensions from the desired dimensions, have an increased significance with respect to variations in drive current strength.

SUMMARY OF THE INVENTION

Generally, the present invention relates to a method of producing a semiconductor device with transistors having controlled drive current strength. Consistent with the present invention, a semiconductor device is formed by forming a gate electrode over a substrate. The length of the gate electrode is measured and compared to a desired design length. A spacer is formed on the gate electrode. The size of the spacer is determined, based on the difference between the measured and designed length of the gate electrode layer. Thus, the spacer can be varied to take into account the variation in gate electrode length from the desired value. This allows the drive current strength of the final semiconductor device to be controlled and also permits variations within and between lots of the semiconductor devices to be reduced. The spacer can be formed in multiple steps to provide even greater flexibility and accuracy.

The above summary of the present invention is not intended to describe each illustrated embodiment or every implementation of the present invention. The figures and detailed description that follow describe the embodiments more particularly.

BRIEF DESCRIPTION OF THE DRAWINGS

The present invention may be understood more completely in consideration of the following detailed description of the various embodiments of the invention in connection with the accompanying drawings, in which.

Figure 1:
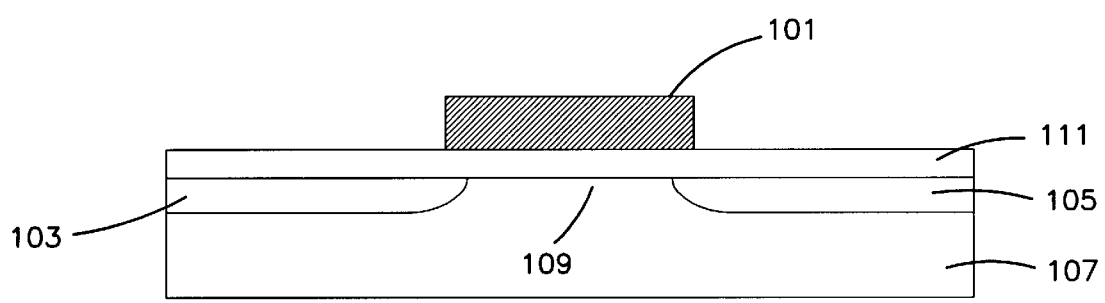
FIG. 1 illustrates the components of a typical MOS semiconductor device.

The invention is amenable to various modifications and alternative forms, and the specifics of the present invention have been shown only by way of example in the drawings, and will be described in detail. It should be understood that intention is not to limit the invention to the particular embodiments described. On the contrary, the intention is to cover all modifications, equivalents and alternatives following the spirit and the scope of the invention as defined by the appended claims.

DETAILED DESCRIPTION OF THE VARIOUS EMBODIMENTS

The present invention is applicable to a variety of semiconductor devices, for example MOS devices such as an NMOS, PMOS, CMOS or BiCMOS device. While the present invention is not so limited, an understanding of the various aspects of the invention is best gained through a discussion of various application examples of the processes used to form the devices.

The present invention utilizes the relationship between channel length (which in turn can be controlled by the gate electrode length and spacer dimensions) and drive current strength to control drive current strengths of semiconductor devices. This, for example, allows the fabrication of semiconductor devices having transistors with substantially constant drive strengths, and allows the reduction of variation in drive current strength within and between batches, with corresponding increases in productivity. The present invention typically will permit the drive current strength to be controlled, for example, to within about plus or minus 30 $\mu a/\mu m$, and the variation in drive current strength within and between lots also can be controlled to this tolerance. Typical drive current strengths are generally in the range of, for example, about 200–1000 $\mu a/\mu m$.

The drive current strength that is controlled may be, for example, either the source-drain current, the effective drive current or the off-state drive current, or any combination of these. The effective drive current $Id_{eff}$ of a transistor may, for example, be determined using well-known techniques, such as measuring the source-drain current of the transistor while applying a known voltage to the gate and the drain, and grounding the source of the transistor, and dividing the source-drain current by the transistor width. The transistor width may, for example, be the length of the polysilicon gate electrode over its respective active area. The off-state current $Id_{off}$ of a transistor may, for example, be determined using well-known techniques, such as measuring the source-drain current of the transistor while applying a known voltage to the drain of the transistor and grounding the gate and source of the transistor. As a general rule, a change in spacer width of 100 Å can change the drive current strength by about 20 $\mu a/\mu m$.

Figure 2A:
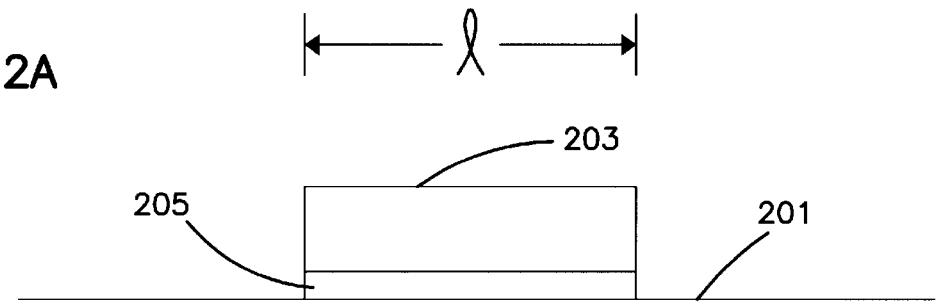
FIG. 2A–C illustrate a fabrication process in accordance with an exemplary embodiment of the present invention.
Figure 2B:
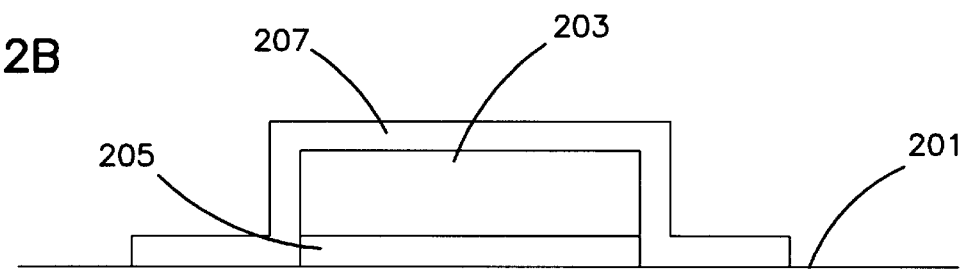
Figure 2C:
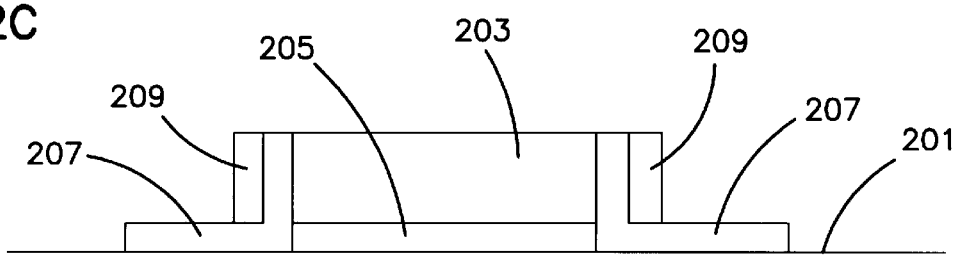
Figure 3:
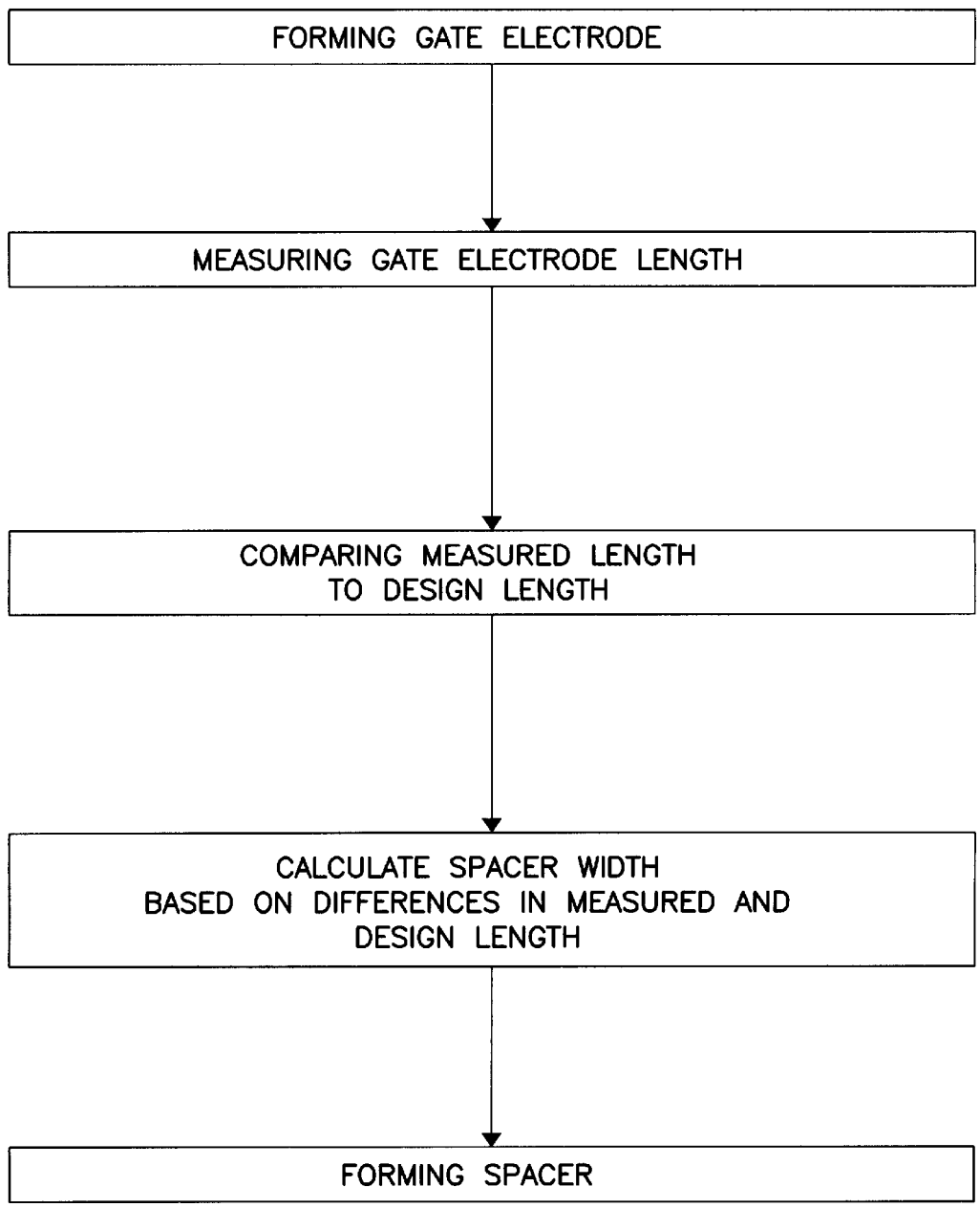
FIG. 3 illustrates a flow chart for an exemplary process in accordance with the present invention.

Referring to FIGS. 2–3, in FIG. 2A, the present process for manufacturing a semiconductor device forms a number of gate electrode 203 over substrate 201. Only one of the gate electrodes 203 is illustrated in the figures for ease of understanding. The illustrated gate electrode is representative of the many gate electrodes that will be present.

The gate electrode 203 can be formed using a number of different known techniques. For example, the gate electrode 203 may be formed by depositing a layer of gate electrode material over the substrate 201, followed by selectively removing portions of the gate electrode layer to leave the gate electrode 203. The gate electrode 203 may be formed of any suitable material, for example polysilicon. The gate electrode 203 may be processed using known techniques, for example a photolithographic technique in which a layer of photoresist is formed over the gate electrode layer, followed by patterning and removal of part of the photoresist layer, followed by etching of the exposed portions of the gate electrode layer.

Generally, a gate insulator 205 will be present between the gate electrode 203 and the substrate 201. The gate insulator 205 can be formed of any suitable insulating material providing the desired insulating characteristics. Suitable materials include, for example, oxide or nitride. The gate insulator 205 can be formed using, for example, well-known growth or deposition techniques, and in a suitable thickness, depending on the specific application.

After the gate electrode 203 has been formed, its dimensions, particularly the length, are measured. For the purposes of this application, the "length" l of the gate electrode will be used to define the dimension of the gate electrode 203 in the direction parallel to the channel. This measurement can be carried out, for example, with a scanning electron microscope. The measurement may be carried out in situ after formation of the gate electrode 203, or the substrate could be transferred to a separate measuring station for measurement if desired.

A single gate electrode on a given substrate can be measured as reflecting the relative variation of gate electrode length from the desired value for all gate electrodes on that substrate. It also would be possible to measure any desired number of electrodes on a given substrate. A single substrate within a batch can be measured as reflecting the relative variation of gate electrode length from the desired value for all of the substrates being processed in that production batch. It also would be possible to measure any desired number, or even all, of the substrates in a given production batch.

After the gate electrode 203 has been measured, a spacer is formed on the gate electrode. The width of the spacer is determined based on the measured length of the gate electrode 203. For the purposes of this application, the "width" of the spacer will be used to define the distance spanned by the spacer outward from the side walls of the gate electrode 203. The determination of the spacer width thus can take into account any variations of the actual gate electrode length from the desired length. This provides enhanced control over the channel length of the transistor and the drive current strength of the transistor. This also permits reductions in the variations within and between production batches. The spacer can be formed by well-known techniques, for example plasma deposition and CVD processes.

As can be seen in FIGS. 2B and 2C, in one embodiment of the present invention the spacer formation can be carried out in a two step process. However, a single step formation may be useful as well in some cases. For example, while the two step process provides certain options for different process flows as discussed below, in the cases where these options are not needed, a single step spacer formation may be sufficient.

In the exemplary embodiment of FIG. 2B and 2C, a first spacer 207 is formed over the gate electrode 203, including the side walls of the gate electrode 203. A second spacer 209 then is formed on the first spacer 207. The widths of the first and second spacers are determined to provide a desired total spacer width, taking into account the actual gate electrode length. In this embodiment, it is possible to measure the width of the first spacer 207 before forming the second spacer 209.

In some applications for the two step spacer formation it may be useful to form the first spacer 207 as a relatively thin layer over the substrate 201 as well as the gate electrode 203. In this case, the thickness of the spacer 207 over the substrate (and the width of the spacer) typically will be in the range of 50–100 Å, which generally will be thin enough to permit later dopant implanting through the first spacer layer 207 and into the substrate 201. The width of the first spacer 207 (or the combined length of the gate electrode and width of the first spacer) can be measured before the formation of the second spacer 209 if desired. This information can be used in determining conditions for the second spacer formation. The measurement can be conducted in situ or in a separate measuring station as desired.

The second spacer 209 then is formed. Typically, the width of the second spacer 209 will be in the range of about 50–600 Å, as needed for the desired final dimension. A further measurement can be carried out after the second spacer 209 is formed, and the second spacer 209 can be subjected to suitable removal processes, for example, etching, in order to provide the desired final dimensions. Again, the measurement can be carried out in situ or at a separate measuring station. Generally, the second spacer 209 will be formed over the entire surface of the spacer 207. The second spacer can be removed from the upward-facing surfaces of the first spacer 207 to form the structure illustrated in FIG. 2C. This can be accomplished, for example, by anisotropic etching. In some cases, the first spacer 207 will be removed from the upper surface of the gate electrode, while in other cases it may be desired to leave some or all of the first spacer 207 intact on the upper surface of the gate electrode.

The two step spacer formation of one embodiment of the present invention advantageously can be adapted for reworking. In this case, the material of the second spacer should be selectively removable with respect to the first spacer material. For example, the first spacer can be oxide and the second spacer can be nitride. Thus, if the result of the second spacer formation does not yield the desired result, the second spacer can be partially or completely removed and re-formed. In this case, the first spacer 207 can serve as a protective layer shielding the substrate 201 from attack by the agent used to remove the second spacer 209. Of course, it also would be possible to further remove the first spacer 207, or to remove an entire spacer that was formed in a single step if desired. In these latter instances more care might be required to avoid damage to the substrate.

The two step spacer formation of one embodiment of the present invention also is adaptable for different dopant implanting schemes. For example, if the total of the first and second spacer widths is sufficiently small (so that the thickness of the spacers 207 and 209 on the substrate 201 also is small), all dopant implanting can be done through the first and second spacers that have been formed.

Alternatively, the two step spacer formation can be used to facilitate various dopant implanting schemes. It would be possible, for example, to carry out LDD implanting (i.e. low density doping to form a lightly-doped region in the substrate) after the first spacer is formed but before the second spaced is formed, and carry out source-drain implanting (i.e. high density doping to form a heavily doped region in the substrate) after the second spacer is formed. In this situation, the first spacer 207 can act as the spacer for the LDD implanting, and its width will be selected accordingly. As another example, source-drain implanting could be conducted after the second spacer 209 is formed. The second spacer 209 then could be removed and the LDD implanting could be carried out. Again, the first spacer 207 will act as a spacer for the LDD implanting in this case. As yet another example, LDD implanting could be carried out before formation of the first spacer 207, a medium dose implanting could be carried out after formation of the first spacer 207, and source-drain implanting could be carried out after the second spacer 209 is formed. A similar process again could be carried out in the reverse order, i.e. conducting the source-drain implanting after formation of the second spacer 209, followed by removal of the second spacer with subsequent implanting and removal of the first spacer with subsequent implanting.

Similar variations can be applied to a single step spacer formation if desired. For example, LDD implanting could be carried out before spacer formation and source-drain implanting could be carried out after the spacer is formed. Alternatively the source drain implanting could be carried out after the spacer is formed, and then the spacer could be removed prior to LDD implanting.

The process of the present invention also is adaptable for a variety of process flows. For example, in the case of a CMOS device, the spacers for the N-channel and P-channel could be formed separately. That is, the P-channel regions would be protected during the formation of the N-channel spacers and subsequent doping. The formation of the electrodes for the different channels could involve the formation of different gate insulating layers, if desired.

As noted above, the present invention is applicable to the fabrication of a variety of different devices where the advantages of controlled drive current strength are desired. Accordingly, the present invention is not limited to the particular examples described above, but rather should be understood to cover all aspects of the invention as fairly set forth in the attached claims. Various modifications, equivalent process and other structures to which the present invention may be applicable will be readily apparent to those of skill in the art upon review of the present specification. The claims are intended to cover such modifications and devices.

We claim:

1. A semiconductor device including a plurality of substrates, each substrate including at least one transistor, each of the transistors composed of a gate electrode length that includes at least one spacer and a gate electrode, the at least one spacer having a width, comprising:

the plurality of substrates being formed in first and second batches; and the transistors of the first and second batches having different gate electrode lengths and different spacer widths and substantially the same drive current strengths, wherein each of the spacers are disposed on a sidewall of the transistor and are composed of a first and second spacer, the second spacer disposed on the first spacer and spaced from the substrate.

2. The apparatus of claim 1, wherein the second spacers are made of a material that is selectively removable with respect to the material of the first spacers.

3. A semiconductor device, comprising:

a substrate having a first transistor formed thereon, the transistor including a gate electrode stack;

a first spacer member disposed on a sidewall of the gate electrode stack having a predetermined layer thickness and having a width, the width extending laterally from the sidewall of the gate electrode and the first spacer having a lateral portion exceeding the predetermined layer thickness;

a second spacer member disposed on a sidewall of the first spacer member and on the lateral portion of the first spacer member, such that the second member width does not exceed the first member width wherein the second spacer member is disposed on the first spacer member and spaced from the substrate; and a second transistor on the substrate having a different gate electrode length and a different spacer width from the first transistor, wherein the first and second transistors have substantially the same drive current strengths.

4. The device of claim 3, wherein the gate electrode is polysilicon.

5. The device of claim 3, wherein the spacer members are made of material from the group consisting of silicon nitride and silicon oxide.

6. The device of claim 3, wherein the second spacer is formed of a material that is selectively removable with respect to the material of the first spacer material.

7. The device of claim 5, wherein the thickness of the first spacer is in the range of about 50–100 Angstroms.

8. The device of claim 7, wherein the width of the second spacer is in the range of about 50–600 Angstroms.

9. A semiconductor device, comprising:

a substrate having a first transistor formed thereon, the transistor including a gate electrode stack;

a first spacer member disposed on a sidewall of the gate electrode stack having a predetermined layer thickness in the range of about 50–100 Angstroms and having a width, the width extending laterally from the sidewall of the gate electrode and the first spacer having a lateral portion exceeding the predetermined layer thickness; and a second spacer member, having a thickness in the range of about 50–600 Angstroms, disposed on a sidewall of the first spacer member and on the lateral portion of the first spacer member, such that the second member width does not exceed the first member width wherein the second spacer member is disposed on the first spacer member and spaced from the substrate and wherein the spacer members are made of material from the group consisting of silicon nitride and silicon oxide and wherein the first and second spacer members have a top surface, the top surface of each spacer member being coplanar with each other.

10. The device of claim 9, wherein the top surfaces of the first and second spacer members are substantially coplanar with a top surface of the gate electrode.

11. The device of claim 3, wherein the spacer members are made of material from the group consisting of silicon nitride and silicon oxide.

12. The device of claim 11, wherein the thickness of the first spacer is in the range of about 50–100 Angstroms.

13. The device of claim 12, wherein the width of the second spacer is in the range of about 50–600 Angstroms.

14. The device of claim 13, wherein the first and second spacer members have a top surface, the top surface of each spacer member being coplanar with each other.

15. The device of claim 3, wherein the semiconductor device is a CMOS device and the method further comprises forming an NMOS device and a PMOS device.

16. A system for forming a semiconductor device, comprising:

means for forming a gate electrode over a substrate;

means for measuring the length of the gate electrode;

means for forming a spacer on the gate electrode based on the measured gate electrode length; and means for doping a portion of the substrate.

17. The system of claim 16, further comprising:

means for comparing the measured length of the gate electrode with a desired value and means for determining a width for the spacer taking into account any difference between the measured length of the gate electrode and the desired value.

* * * * *